United States Patent [19]

Korsunsky et al.

[11] Patent Number: 4,968,259
[45] Date of Patent: Nov. 6, 1990

[54] HIGH DENSITY CHIP CARRIER SOCKET

[76] Inventors: Iosif Korsunsky, 3971 Dora Dr., Harrisburg, Pa. 17110; Monte L. Kopp, Clark Valley Farms, R.D. #1 Box 98, Tower City, Pa. 17980; Dimitry G. Grabbe, 2160 Rosedale Ave., Middletown, Pa. 17057

[21] Appl. No.: 392,809

[22] Filed: Aug. 11, 1989

Related U.S. Application Data

[63] Continuation-in-part of Ser. No. 191,635, May 6, 1988, Pat. No. 4,872,845, which is a continuation-in-part of Ser. No. 116,770, Nov. 3, 1987, abandoned.

[51] Int. Cl.$^5$ ............................................. H01R 23/72
[52] U.S. Cl. ..................................... 439/73; 206/331; 439/892
[58] Field of Search ..................................... 439/68–73, 439/525, 526, 892; 206/328, 331; 174/52.4, 138 G

[56] References Cited

U.S. PATENT DOCUMENTS

| | | | |
|---|---|---|---|
| 3,380,016 | 4/1968 | Samson et al. | 206/328 |
| 3,796,921 | 3/1974 | Fischer | 439/526 |
| 4,060,296 | 11/1977 | Kunkle et al. | 439/70 |
| 4,872,845 | 10/1989 | Korsunsky | 439/330 |

*Primary Examiner*—Neil Abrams

[57] ABSTRACT

Chip carrier sockets, for providing an electrical connection between a first electrical component and a second electrical component, have terminals provided therein, the terminals have contacting portions and retention portions provided thereon. The contacting portions are provided to electrically engage leads of a chip carrier with is positioned in a recess of the chip carrier socket. A spacer is provided between the contacting portions and the retention portions, such that the spacer has a greater width than the distance provided between the contacting portion and the retention portion, This spacing, in combination with a resilient member, insure that the spacer is resiliently forced against the contacting portion and the retention portion, thereby insuring that the first electrical component will be positioned and maintained in electrical engagement with the contact portion of the terminal.

5 Claims, 8 Drawing Sheets

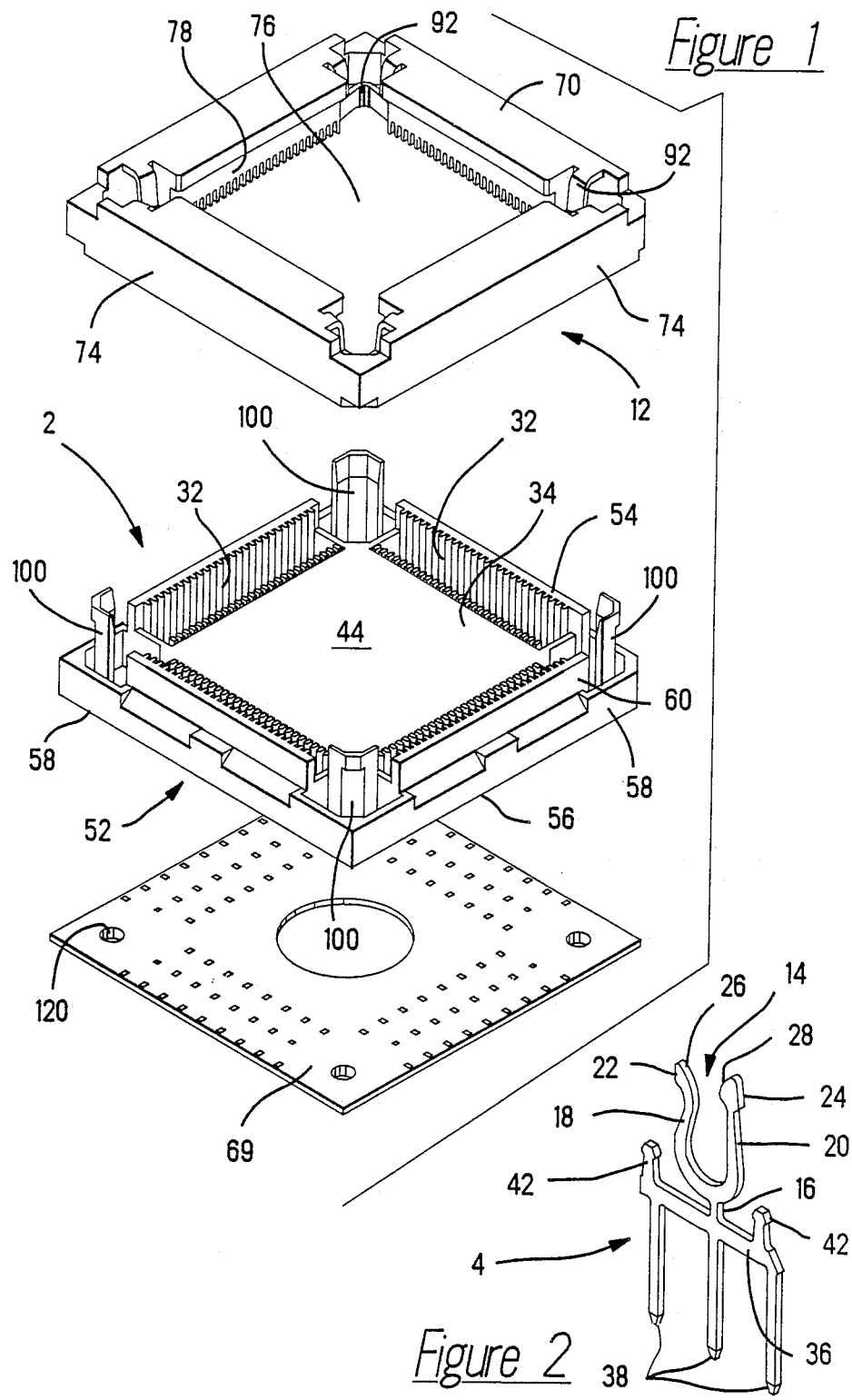

HIGH DENSITY CHIP CARRIER SOCKET

CROSS REFERENCE TO RELATED APPLICATION

This application is a continuation-in-part of U.S. application Ser. No. 191,635 filed May 6, 1988, now U.S. Pat. No. 4,872,845, which is a continuation-in-part of U.S. application Ser. No. 116,770 filed Nov. 3, 1987.

FIELD OF THE INVENTION

The invention relates to a chip carrier socket for use with chip carriers which have modified gull wing leads or the like. In particular, the invention is directed to a means for suppling the contact force required between the terminals of the chip carrier socket and the leads of the chip carrier. The contact force being sufficient to compensate for the dimensional variations in the chip carrier and the chip carrier socket as a result of manufacturing tolerances.

BACKGROUND OF THE INVENTION

Integrated circuits are commonly mounted in chip carriers which are bodies of insulating material having side surfaces to which conductors from the integrated circuit extend. Traditionally, terminal pads are provided on the side surfaces of the chip carrier body and contact is made with these pads to connect the integrated circuit to conductors on a substrate, such as a ceramic substrate or a circuit board. Electrical connection is usually established with the terminal pads on the chip carrier by means of a chip carrier socket which comprises a socket body having a recess which receives the chip carrier and contact terminals in surrounding relationship to the recess so that when the chip carrier is placed in the recess, the contact terminals electrically engage the terminal pads of the chip carrier.

Notwithstanding the relatively small size of the chip carrier socket and the contact terminals in the socket, it is necessary that each terminal be capable of exerting contact force on a terminal pad in a chip carrier in the range of about 200 to 400 grams in order to establish good electrical connection between the contact terminal and the terminal pad on the chip carrier, particularly if the terminal pad is tin plated rather than gold plated. It should also be noted that chip carriers and chip carrier sockets are subject to the dimensional variations which all mass produced parts are subjected to. These dimensional variation result from manufacturing tolerances. However, even with dimensional variations, the design and performance requirements discussed briefly above must be satisfied even in "worst case" conditions. For example, the minimum 200 gram contact force required for each contact must be met even if the particular terminal pad that a contact terminal engages is at the lower end of the tolerance range and the contact terminal similarly is at the lower end of the tolerance range for the parts.

For the new emerging family of modified gull wing chip carriers, a new socket is required. The contact force, etc. discussed above must remain the same in order to insure that a proper electrical connection is maintained.

It can be appreciated from the foregoing remarks that many of the types of contact terminals used in prior art connectors are not suitable for use with chip carriers which utilize the modified gull wing technology. It would therefore be beneficial to provide a chip carrier socket with the capability to insure that the appropriate force be exerted on the contact terminals, regardless of the dimensional variations, etc. associated with the components.

SUMMARY OF THE INVENTION

For the new emerging family of modified gull wing chip carriers, a new chip carrier socket is required. Particularly, for the chip carriers that have large variations of the critical dimensions, which causes the leads of the chip carrier to not be uniformly positioned. It is therefore necessary to have the terminal of the chip carrier socket be able to compensate for the variations of positions of the leads of the chip carrier.

In accordance with one aspect thereof, the invention is directed to a chip carrier socket for use with an integrated circuit chip carrier. The chip carrier has spaced apart contact leads which extend from respective side walls of the chip carrier at an angle relative to the side walls, the leads have free ends which are bent relative thereto. The chip carrier socket has a recess for the reception of the chip carrier therein. Contact receiving cavities are positioned in surrounding relationship to the recess, the contact receiving cavities have contact terminals disposed therein.

Each terminal has a contacting section which cooperates with the leads of the chip carrier and a base section which cooperates with a second electrical component. Spacer means are provided in engagement with the contacting section such that the spacer means are movably mounted in the contacting section of the terminal. The spacer means cooperates with the contacting section to position the respective lead of the chip carrier in electrical engagement with the contacting section. Resilient means cooperate with the spacer means and the contacting section, thereby insuring that the leads of the chip carrier are maintained in electrical engagement with the respective contacting section of the terminal.

In accordance with another aspect of the invention, an electrical terminal is disclosed. The terminal provided the electrical pathway required to electrically connect a first electrical component to a second electrical component.

The terminal has a contacting section and a base section, the contacting section cooperates with the first electrical component and the base section cooperates with the second electrical component. Spacer means are movably mounted in the contacting sections, the spacer means cooperate with the contacting sections to position the first electrical component in electrical engagement with the contacting sections. Resilient means cooperate with the spacer means and the contacting section to insure that the first electrical component is positioned and maintained in electrical engagement with the contacting section.

BRIEF DESCRIPTION OF THE DRAWINGS

FIG. 1 is an exploded perspective view of a chip carrier socket of the present invention.

FIG. 2 is an enlarged perspective view of a terminal which is provided in the chip carrier socket.

DETAILED DESCRIPTION OF THE INVENTION

Figure 3:
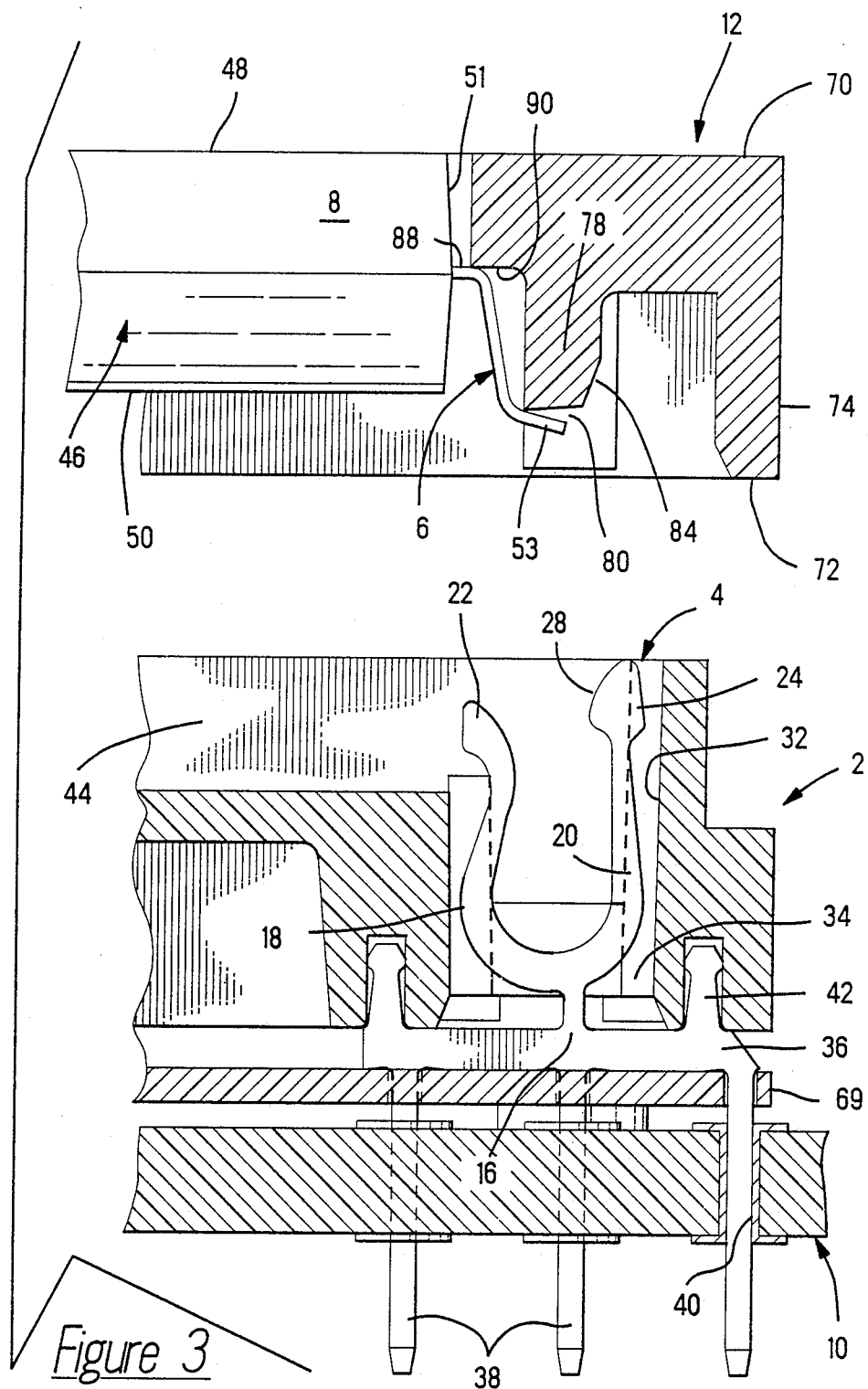
FIG. 3 is a partial cross sectional view of the chip carrier socket showing the terminals of the socket prior to the insertion of the cover-chip carrier subassembly therein.

The figures show a chip carrier socket 2 containing terminals 4 which engage contact leads 6 of a chip carrier 8 and which are soldered or otherwise connected to conductors on or in a substrate 10. An individual terminal 4 will first be described and structural details of the chip carrier socket 2 and a cover 12 used in cooperation therewith will then be described.

Each terminal 4 (FIG. 2) is a complanate or flat member of the type commonly produced by etching or by stamping sheet metal so that it has oppositely facing major surfaces and edges extending between the major surfaces. The thickness of the terminals may vary depending upon the requirements in a particular situation.

As is best shown in FIG. 2, each terminal 4 comprises a resilient portion 14 having a flexible leg 16 extending from the resilient portion 14. The resilient portion 14 has a rounded, U-shaped configuration which is comprised of two resilient arms 18, 20. The first resilient arm 18 and the second resilient arm 20 have free ends 22, 24 which are spaced from each other but which are flexed relatively away from each other when the terminal 4 is stressed. As is best shown in FIGS. 3 and 4, resilient arm 20 is slightly longer than resilient arm 18.

Figure 4:
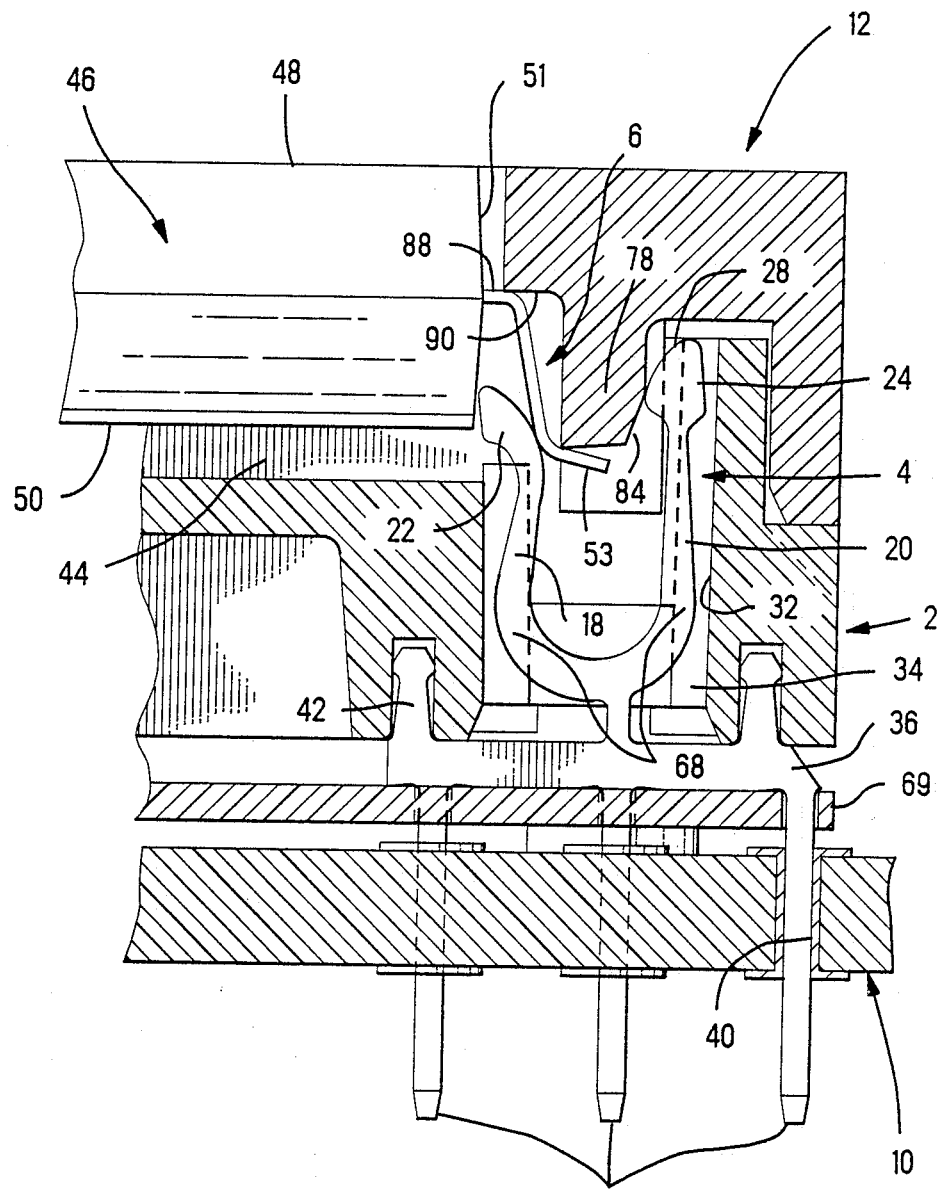
FIG. 4 is a partial cross sectional view similar to that of FIG. 3, showing the chip carrier socket after the cover-chip carrier subassembly has been inserted therein.

The first resilient arm 18, of each terminal 4, is a contact arm and has a rightwardly facing, as viewed in FIG. 3, contact surface 26 which cooperates with a respective lead 6 of the chip carrier 8. The second resilient arm 20 has a leftwardly facing lead-in surface 28 which helps to guide the cover 12 into place. It should be noted that neither of the free ends 22, 24 nor any portion of the resilient arms 18, 20 is in engagement with side surfaces 32 of a terminal receiving cavity 34 of socket 2 when the terminal 4 is in an unstressed or first position, as shown in FIG. 3.

The U-shaped resilient portion 14 is pivotally mounted on leg 16. This allows the U-shaped resilient portion 14 to adjust for any dimensional variation or misalignment of the chip carrier 8 when the chip carrier is inserted into the socket 2. Dimensional variation or misalignment of the chip carrier 8 can cause the component lead positions to vary. Therefore, it is important that the U-shaped resilient portion 14 of each terminal 4 be free to pivot in order to compensate for this varied lead position. Consequently, as the terminals 4 of the socket 2 can adjust to the varied position of the leads 6 of the chip carrier 8, a positive electrical connection will be effected and maintained between each lead 6 and the respective terminal 4.

The leg 16 of each terminal 4 is integrally attached to a horizontal bar 36 from which a number of mounting portions 38 extend downward, as is shown in FIG. 2. As is indicated in FIGS. 3 and 4, all but one of these mounting portions 38 are removed from any given terminal 4, thereby providing the required footprint to match the holes 40 in the substrate 10.

Each horizontal bar 36 has two support portions 42 which extend upward, in the same direction as leg 16. These support portions 42 are provided to cooperate with the housing of the socket 2 to provide support for the side walls 32 of the terminal receiving cavity 34.

When the terminals 4 are contained in the chip carrier socket 2 which in turn is mounted on a substrate 10 and a chip carrier 8 is placed in a chip carrier receiving recess 44 of the chip carrier socket 2, leads 6 and a portion of cover 12 extend between free ends 22, 24 of resilient arms 18, 20, as shown in FIG. 4. The effect is to impose a force on the free ends 22, 24 of the resilient arms 18, 20 of the terminals 4. As a result of the imposition of this force, the resilient arms 18, 20 function as a spring system and the arms 18, 20 are flexed relatively away from each other. The stresses induced in the terminal 4 as a result of the force are largely concentrated in the arms 18, 20, and only a very minor portion of the force is transmitted through the leg 16 to the horizontal bar 36 and to the mounting portions 38. This is a highly desirable feature because a transfer of large forces to the mounting portions 38 would create stresses on the relatively weak solder joints. These stresses would result in the failure of the connection. Consequently, it is extremely important to prevent large stresses from being transferred to the mounting portions 38.

Turning now to FIG. 3, the previously identified chip carrier 8 comprises, in the disclosed embodiment, a generally square chip carrier body 46 having upper and lower major surfaces 48, 50 and side surfaces 51. Side surfaces 51 extend between first major surface 48 and second major surface 50. Side surfaces 51 are slightly bowed, as is best shown in FIGS. 3 and 4. The leads 6 extend into the body 46 and are connected to the integrated circuit chip (not shown) therein. These leads 6 extend from side surfaces 51 of body 46 in a generally downward fashion, (modified gull wing configuration) as is shown in the FIG. 4. The end portions 53 of leads 6 are bent such that the bottom surface of end portions 53 are approaching parallel to the lower major surface 50.

Chip carrier 8 has projections 55 extending from the corners thereof. Projections 55 extend from the first major surface 48 to the second major surface 50. The sides of projections 55 have the same bowed configuration as side surfaces 51.

Referring to FIG. 1, the chip carrier socket 2 comprises a socket body 52 having first and second major surfaces 54, 56 and side surfaces 58. The side surfaces 58 have an offset portion 60 proximate the first major surface 54, the offset portion 60 being provided to cooperate with the cover 12, as will be discussed. Chip carrier receiving recess 44 extends from the first major surface 54 toward the second major surface 56 and has recess side surfaces which correspond to respective side walls 32 of terminal receiving cavities 34 which extend to the second major surface 56 of socket 2.

Terminal-receiving cavities 34 are provided in the recess 44 and extend from the first major surface 54 to the second major surface 56. Each cavity 34 extends from proximate a corner of the recess 44 to proximate an adjacent corner of the recess 44. Cavities 34 have a general rectangular shape. Side-by-side slots 68 are provided on side walls 32. These slots 68 cooperate with the respective terminals 4 to align the terminals 4 in the proper position. As is shown in FIGS. 3 and 4, the terminals 4 are positioned in the slots 68, thereby preventing the terminals 4 from engaging each other, which in turn prevents the terminals 4 from shorting. It should be noted, that in order for chip carrier 8 to be inserted into chip carrier receiving recess 44, respective inner side walls 32 can not extend all the way to the first major surface 54.

As is best shown in FIGS. 3 and 4, terminals 4 do not contact side walls 32 when the terminals 4 are in an unstressed position. However, the spacing between side walls 32 is dimensioned such that the side walls 32 act as overstress means as the terminals 4 are stressed, i.e. sidewalls 32 prevent terminals 4 from bending far enough to take a permanent set. Consequently, side walls 32 of terminal receiving cavities 34 prevent the terminals 4 from taking a permanent set which would result in an ineffective electrical connection. In order to provide the side walls 32 with enough support to prevent the overstress of the terminals 4, the support members 42 which extend from the horizontal bars 36 of the terminals 4 are positioned in the housing 52 of the chip carrier socket 2. The positioning of terminals 4 allows the strength of the metal terminals 4 to reinforce the strength of the plastic housing 52, thereby providing the side walls 32 with the support necessary to prevent the overstress of the terminals 4.

Mounting portions 38 of terminals 4 extend from the second major surface 56 of chip carrier socket 2. A protective strip 69 is provided proximate the ends of mounting portions 38. Protective strip 69 cooperates with mounting portions 38 to maintain mounting portions 38 is proper position and to prevent the bending of mounting portions 38. As chip carrier socket 2 is inserted on the circuit board 10, protective strip 69 is moved along mounting portions 38 until protective strip 69 is proximate second major surface 56, thereby allowing mounting portions 38 to be inserted into circuit board 10.

Figure 5:
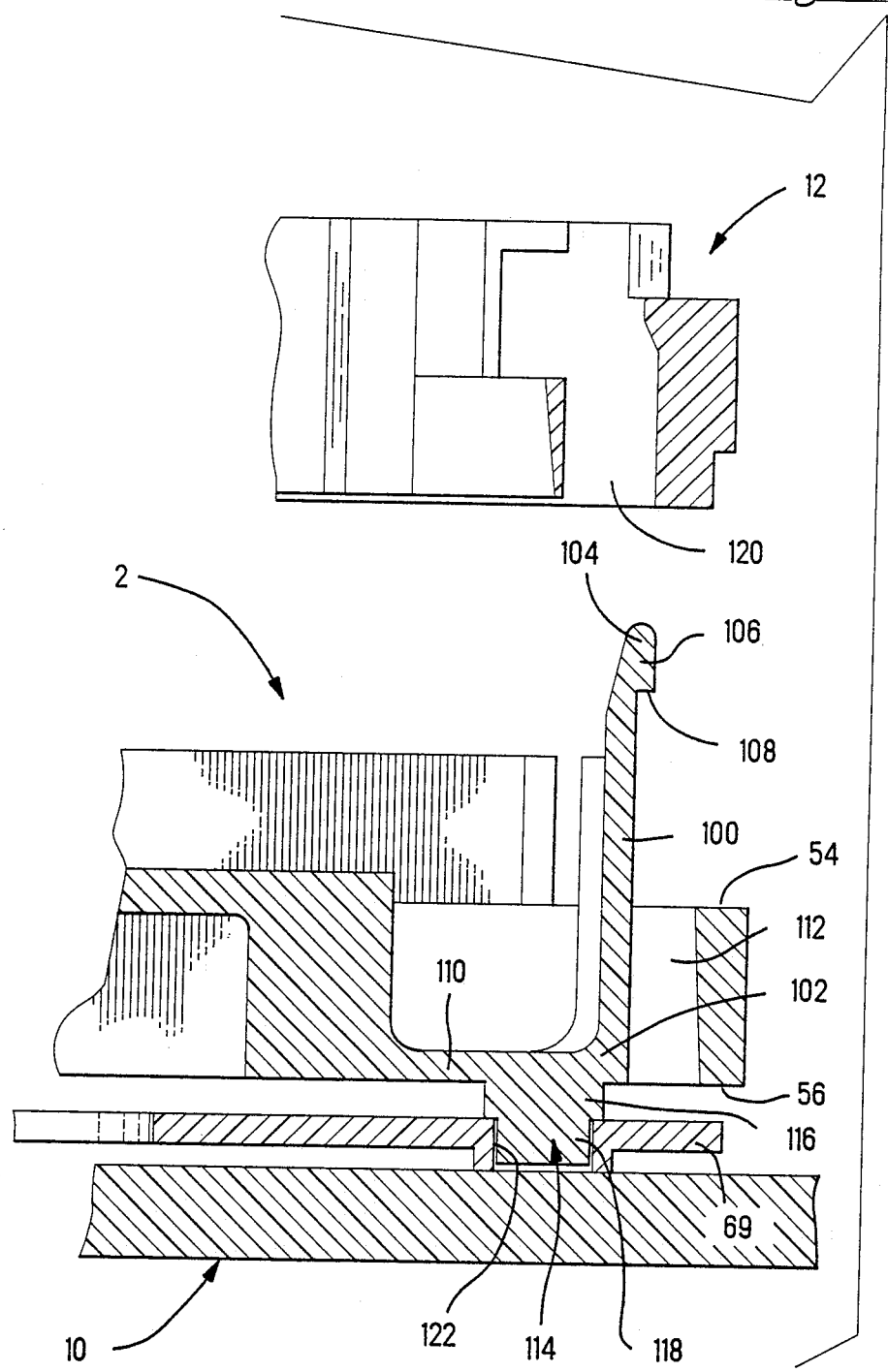
FIG. 5 is a cross section view of the chip carrier socket showing the latch means prior to the insertion of the carrier-chip subassembly therein.
Figure 6:
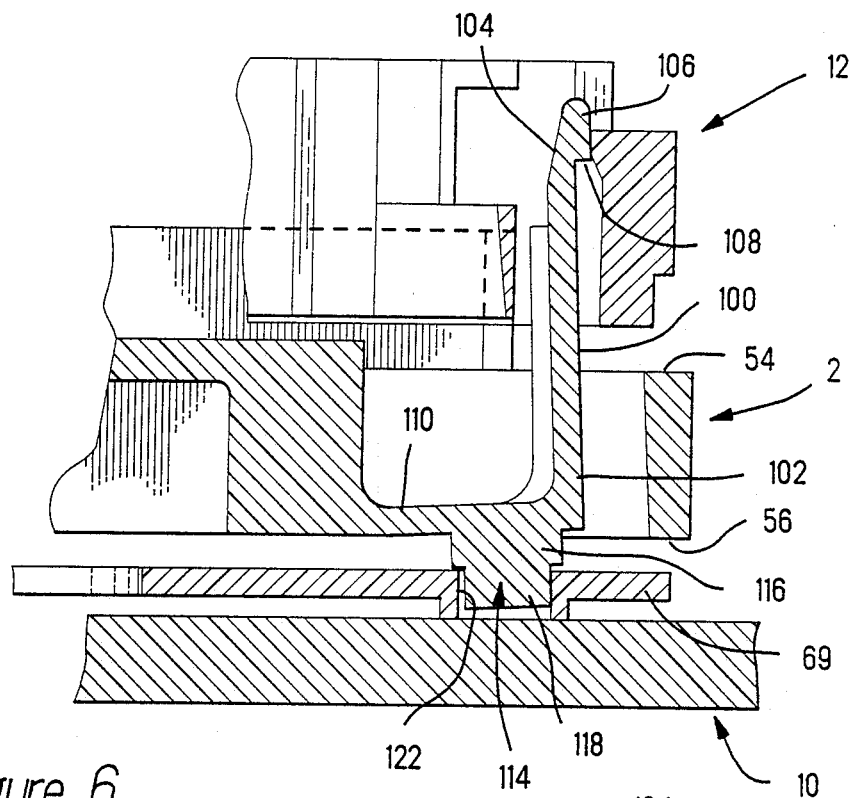
FIG 6 is a view similar to that of FIG. 5, showing the latch means as the subassembly is inserted onto the chip carrier socket.
Figure 7:
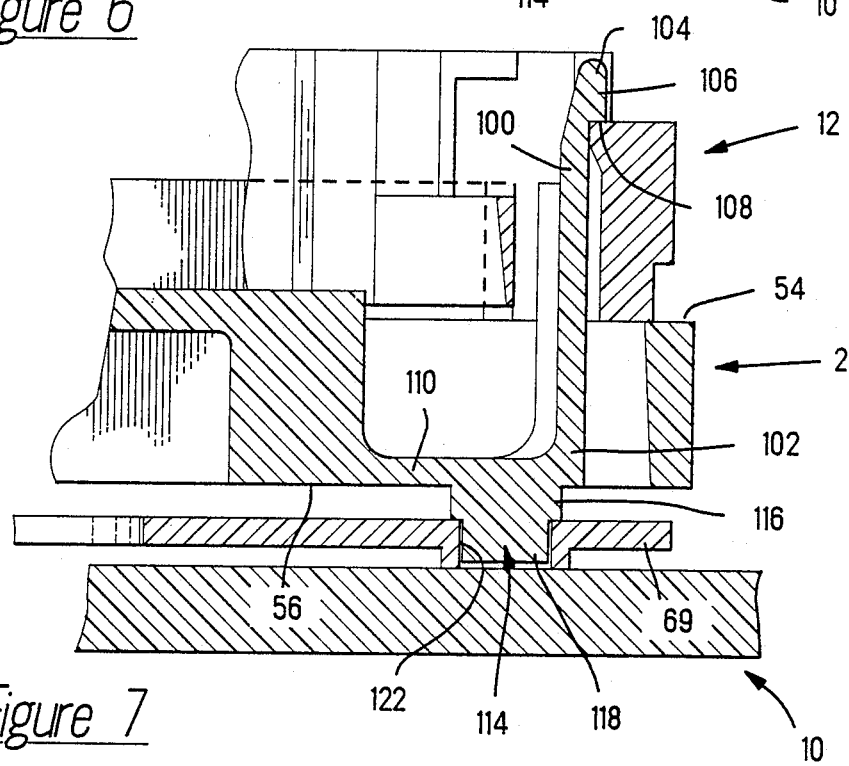
FIG. 7 is a view similar to that of FIG. 5, showing the latch means after the subassembly is fully inserted onto the socket.
Figure 8:
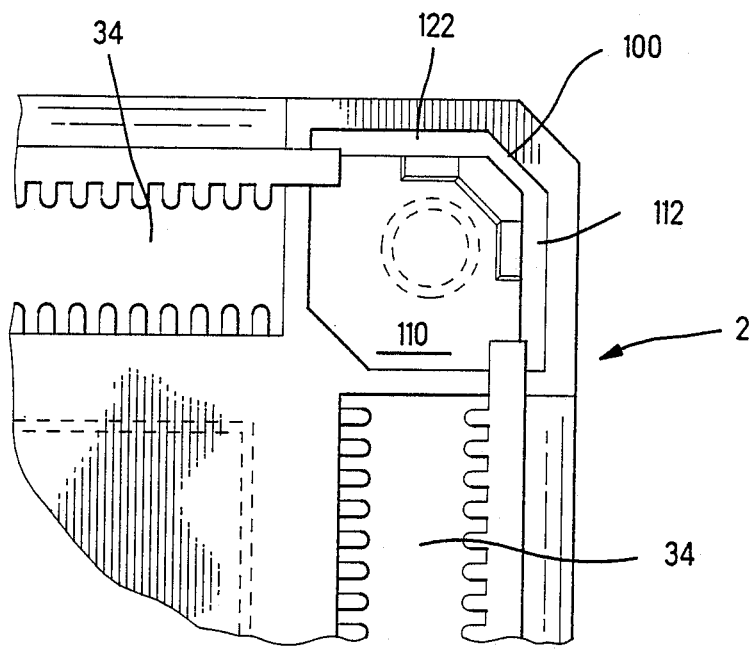
FIG. 8 is a top plan view of a respective latch arm of the chip carrier socket.

Chip carrier socket 2 has latching arms 100 provided proximate the corners of socket body 52, as is shown in FIG. 1. As is shown in FIGS. 5 through 7, latching arms 100 extend from second major surface 56 beyond first major surface 54. When viewed from above, as is shown in FIG. 8, latching arms 100 have a general U-shaped configuration. Each latch arm 100 has a fixed end 102, which is integral with a portion of second major surface 56, and a free end 104. Provided proximate each free end 104 is a latch 106. A shoulder 108 of each latch 106 cooperates with the cover 12 to maintain the cover in position.

As is shown in FIGS. 5 through 7, fixed ends 102 of latch arms 100 are integral with a retention member 110 of second major surface 56. Retention members 110 have openings 112 provided on sides thereof (FIG. 8). As shown in FIG. 5, alignment projections 114 extend downward from retention members 112, away from first major surface 54. Alignment projections 114 are generally cylindrical in shape. First portions 116 of projections 114 have a larger diameter than second portions 118. The second portions 118 of projections 114 cooperate with openings 122 provided in protective strip 69. As is shown in the drawings, openings 122 have a larger diameter than second portions 118. This allows projections 114 to move relative to protective strip 69, as will be discussed.

Referring to FIG. 1, cover 12 cooperates with the chip carrier 8, to prevent damage to the leads 6 of the chip carrier 8. Cover 12 is comprised of a first major surface 70, a second major surface 72, and side surfaces 74 extending therebetween. A chip carrier receiving recess 76 is provided in cover 12. The chip carrier receiving recess 76 extends from the first major surface 70 to the second major surface 72.

Extending in the recess 76 are chip carrier protective arms 78 which cooperate with the leads 6 of the chip carrier 8, as shown in FIGS. 3 and 4. Each lead 6 of chip carrier 8 is positioned in a slot 80 of arm 78. These slots 80 are provided to prevent leads 6 from electrically engaging one another, and also to provide protection to the leads 6, preventing the leads 6 from being damaged as the chip carrier 8 is inserted into the chip carrier socket 2.

As is best shown in FIGS. 3 and 4, protective arms 78 have surfaces 82 which cooperates with second resilient arms 20. Lead-in surfaces 84 are provided on arms 78 proximate the second major surface 72.

Chip carrier 8 is inserted into the cover 12 through the second major surface 72 thereof. Insertion of the chip carrier 8 continues until leading surfaces 88 of the leads 6 engage surfaces 90 of slots 80. This engagement prevents the chip carrier 8 from being further inserted in cover 12.

Figure 9:
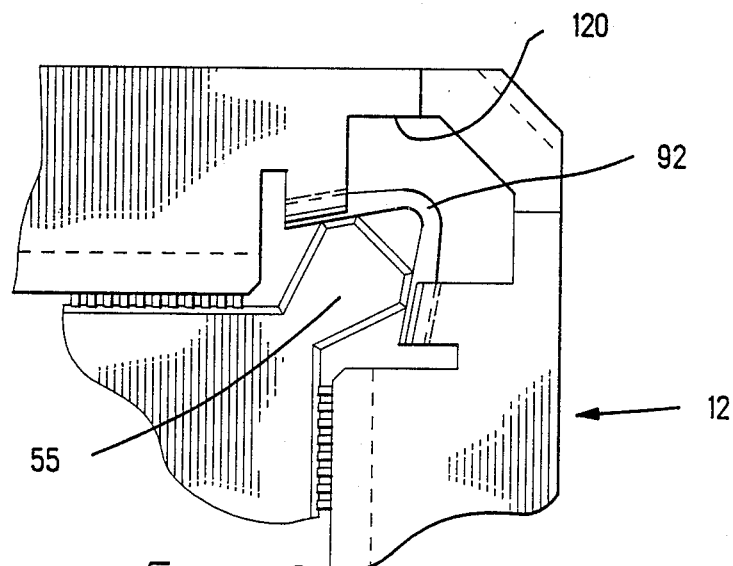
FIG. 9 is a top plan view of a respective securing arm of the cover.

The chip carrier 8 is maintained in the cover 12 by the cooperation of the projections 55 of the corners of the chip carrier socket 2 and securing arms 92 of the cover 12, as is best shown in FIG. 9. As is shown in FIG. 9, resilient securing arms 92 engage respective surfaces of projections 55 of the chip carrier 8. These respective surfaces are angled. Consequently, as the chip carrier 8 is inserted into the cover 12, the resilient securing arms 92 will provide enough frictional engagement to prevent the chip carrier 8 from falling out of the recess 76 of the cover 12. Provided proximate securing arms 92 ar ⓔopenings 120. Openings 120 extend from first major surface 70 through second major surface 72.

As is shown in FIG. 1, securing arms 92 are provided in the corners of cover 12. When viewed from above, as is shown in FIG. 9, each securing arm 92 has a U-shape, the ends of which are integrally attached to the cover 12. This type of configuration allows the securing arms 92 to have the resilient characteristics required to insure that the chip carrier 8 is maintained in the cover 12. However, the configuration of the securing arms 92 also provides the strength characteristics required to insure that the securing arms 92 will be reliable over many insertions. As the ends of securing arms 92 are fixed, the insertion of the chip carrier 8 into the cover 12 causes the securing arms 92 to be engaged by the projections 55 of cover 12. This engagement causes securing arms 92 to deflect, to allow the projections 55 to be inserted therein. This deflection can cause failure of the securing arms, if the securing arms are not properly designed. With the ends of the securing arms 92 fixed in place, the securing arms have a twisting, pivoting, resilient motion, which allows the securing arms 92 to have the strength and resilient characteristics required to insure for proper operation over many cycles.

In operation, the chip carrier 8 is inserted into the cover 12 and maintained therein, as was described. The chip carrier and cover subassembly is then inserted into the chip carrier socket 2. This process is shown in FIGS. 3 and 4. FIG. 3 shows the various parts just prior to insertion. As can be seen the terminals 4 of the chip carrier socket 2 are in an unstressed position. It should be noted that the downward force needed t insert the chip carrier-cover subassembly into the chip carrier socket 2 is applied to the cover. It should be noted that as this insertion occurs, leads 6 of chip carrier 8 are forced to conform to the shape of the slots 8 of the cover 12, as shown in FIG. 4. This insures that leads 6 will be in engagement with cover 12, thereby insuring the the force applied to the leads 6 by the resilient arms 18 will be absorbed by the cover 12. Consequently, the fragile leads 6 of the chip carrier 8 are not damaged as insertion occurs, due to only minimal forces being directed at the leads.

As insertion occurs, leads 6 and protective arms 78 are inserted between the resilient arms 18, 20 of the terminals 4. However, as the width of the leads 6 and protective arms 78 is greater than the distance between the free ends 22, 24 of the resilient arms 18, 20, the resilient arms 18, 20 are forced apart. This force insures that as the insertion continues, the leads 6 will frictionally engage the contact surfaces 26 of the resilient arms 18. In other words, a contact wipe action will occur as insertion takes place.

As insertion continues, lead-in surfaces 84 of protective arms 78 will move past lead-in surfaces 28 of resilient arms 20, thereby allowing resilient arms 20 to move toward their unstressed position.

It is extremely important to note that although resilient arms 20 are allowed to move toward the unstressed position, the terminals 4 never reach the unstressed position when the protective arms 78 and leads 6 are inserted therein. Consequently, a force exists at all times between the leads 6 and the contact surfaces 26 of terminals 4, thereby insuring that a positive electrical connection is maintained.

Cover 12 is maintained in position on socket 2 by the cooperation of latch arms 100 and openings 120. The movement of latch arms 100 as cover 12 is inserted onto socket 2 is shown in FIGS. 5 through 7. As can be seen in FIG. 6 the insertion of cover 12 onto socket 2 causes latch arms 100 to resiliently deform. This resilient deformation would be enough to cause failure of the latch arm in many of the prior art connectors. However, the configuration of retention members 112 with latch arms 100 prevents the failure of latch arms 100.

As latch members 100 are forced to resiliently deflect, retention members 112 are also caused to deflect as latch arms 100 are integral with retention members 112. The resilient characteristics of retention members 112 are due to the positioning of openings 120 along the sides of the retention members. The openings 120 allow the retention members to resiliently deform as the latch members 100 are resiliently deformed, as illustrated in FIG. 6. This is an important result because the possibility of failure in the latch arms 100 is reduces. In other words, the forces associated with the insertion of the cover onto the socket, are distributed between the latch arms 100 and the retention members 112. Therefore, the forces associated with the insertion of the cover onto the socket are not enough to prevent a failure of either the latch arms or the retention members.

Upon complete insertion, shoulders 108 of latches 106 are resiliently returned to an unstressed position, such that shoulders 108 cooperate with first major surface 70. Thus, cover 12 is maintained in position until latch arms 100 are released.

This configuration of latch arms 100 provides the advantage of increase reliability over many cycles. Therefore, the covers can be reused if required, thereby reducing costs. Another advantage is that no tools are required for insertion or removal of the cover or the chip carrier. This makes use of the socket in the field a much more practical solution.

Figure 10:
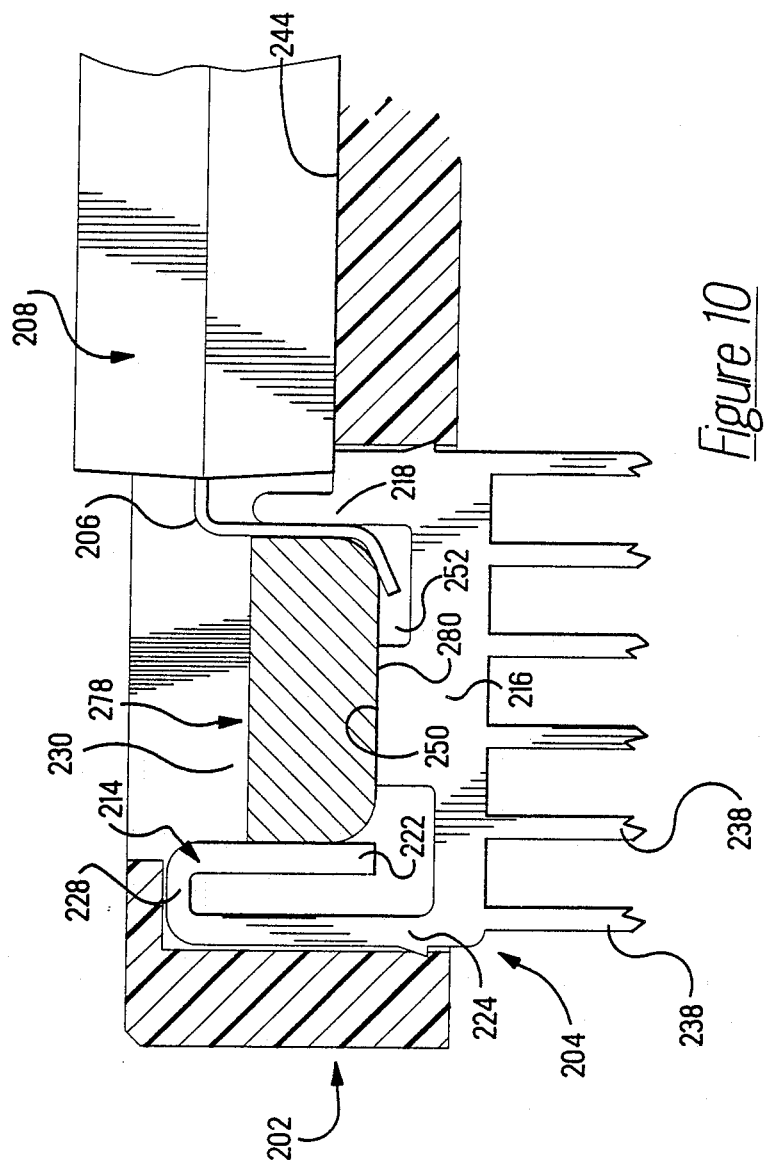
FIG. 10 is a partial cross sectional view of an alternate embodiment of the present invention, showing the chip carrier socket, and the terminals thereof, after the chip carrier has been inserted therein, the spacer is positioned between the terminals of the chip carrier socket and the leads of the chip carrier.

Referring to FIG. 10, an alternative embodiment is shown in which the configuration of the terminal 204 and the configuration of the protective arm or spacer 278 are different than previously described. As shown in FIG. 10, a chip carrier socket 202 contains terminals 204 which engage contact leads 206 of a chip carrier 208 and which are soldered or otherwise connected to conductors on or in a substrate 10.

Each terminal 204 comprises a resilient retention portion 214, a base portion 216, and a contact portion 218. The resilient portions 214 have a generally U-shaped configuration, which have free ends 222 and fixed ends 224 which extend from the base portions 216. The curved sections 228 which extend between the free ends and the fixed ends act as lead-in surfaces, to insure that the spacer will be properly position, as will be discussed. The resilient portions 214 are configured to provide the resilient characteristics required for the operation of the chip carrier socket.

Base portions 216 have top edges 250 which have recesses 252 which are provided therein. The contact portions 218 extend from proximate the recesses 252 of the base portions 216 in a direction away from the bottom edges of the base portions. In this embodiment, the contact portions 218 are rigid. The base portions 216, the resilient portions 214, and the contact portions 218 form spacer receiving recesses 230. Mounting portions 238 extend from the bottom edges of the base portions 216 in a direction away from the top edge. As the mounting portions 238 are essentially identical to the mounting portions 38 previously described, a further explanation will not be provided.

In operation, the chip carrier socket 202, with the terminals 204 provided therein, is mounted to a printed circuit board or the like. A chip carrier 208 is then placed in a chip carrier receiving recess 244 of the chip carrier socket 202. The positioning of the chip carrier in the recess places the leads 206 of the chip carrier in proximity to the terminals 204. Also, the ends of the leads 206 are provided in the recesses 252.

With the chip carrier properly positioned in the recess of the chip carrier socket, the spacer 278 is inserted over the leads 206. The insertion of the spacer 278 continues until a bottom surface 280 of the spacer engages the top edge 250 of the base portion 216. With the spacer fully inserted, the spacer cooperates with the resilient portion 214 and the contact portion 218 to insure that the leads 206 are positioned in electrical engagement with the terminals 204.

As the insertion occurs, the leads 206 and spacer 278 are inserted between the resilient portions 214 and the contact portions 218. The space provided between the resilient portions 214 and the contact portions 218 is less than the width of the spacer and leads. This spacing insures that as the spacer is inserted, the resilient portions 214 will be forced to a stressed position, causing the leads to be forced against the contact portions 218. This force insures that the leads 206 will frictionally engage the contact portions 218 as insertion occurs. In other words, a contact wipe action will occur as the insertion takes place. It is important to note that the resilient portion 214 is resiliently deformed at all times when the spacer 278 is inserted between portions 214 and 218. Consequently, a force exists at all times between the leads 206 and the contact portions 218 of the terminals, thereby insuring that a positive electrical connection is maintained therebetween.

It is worth noting that the spacer 278 can be a separate component or a portion of a cover, similar to that previously described. In either instance the operation of the spacer with the leads is identical.

Figure 11:
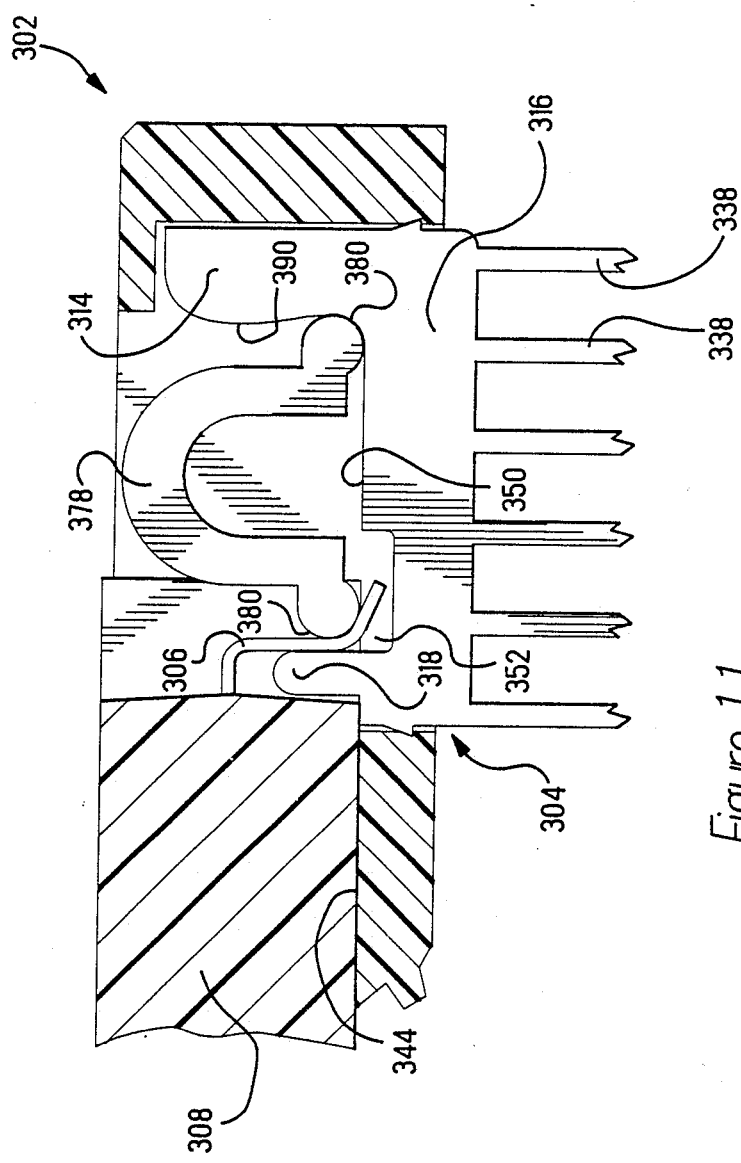
FIG. 11 a partial cross sectional view of a second alternate embodiment of the present invention, showing the chip carrier socket, and the terminals thereof, after the chip carrier has been inserted therein, the resilient spacer is positioned between the terminals of the chip carrier socket and the leads of the chip carrier.

A second alternate embodiment is shown in FIG. 11. As with the embodiment shown in FIG. 10, the housing and cover are similar to that previously described. An exception relates to the terminal receiving cavities which may vary according to the configuration of the terminals to be housed therein. However, as this is not a significant difference, a detailed description of the housing and the cover will not be repeated.

As is shown in FIG. 11, each terminal 304 has a rigid retention portion 314, a base portion 316, and a contact portion 318. The base portions 316 have top edges 350 which have recesses 352 provided therein. The contact portions 318 extend from proximate the recesses 352 of the base portions 316 in a direction away from the bottom edges of the base portions. Contact portions 318 are rigidly attached to the base portions. Retention portions 314 are spaced from contact portions 318. The retention portions also extend from the top edges 350 of the base portions 316 is a direction which is essentially parallel to the direction of the contact portions 318. Mounting portions 338 extend from the bottom edges of the vase portions 316 in a direction away from the top edge. As the mounting portions 338 are essentially identical to the mounting portions 38 previously described, a further explanation will not be provided.

The spacer 378 has the energy storage means provided thereon. As can be seen in FIG. 11, the spacer 378 has a generally U-shaped configuration. Provided at either end of the U-shaped configuration are contact surfaces 380 which cooperate with the leads 306 and the terminals 304 to insure that the leads 306 are in electrical engagement with the terminals 304. The spacer is made from any material having the resilient characteristics required to insure that the leads and the terminals are maintained in electrical engagement, while the terminals may be made of material which does not have the resilient characteristics associated therewith. As an example, the terminals may be of low cost, as no resilient characteristics are required of the terminal, such as for example, inexpensive tin plated, brass material. However, the spacer is manufactured of a good quality spring material, such as BeCu or the like. This type of configuration reduces cost, as the majority of the material used will be the less expensive, nonresilient material.

In operation, the chip carrier socket 302, with the terminals 304 provided therein, is mounted to a printed circuit board or the like. A chip carrier 308 is then placed in a chip carrier receiving recess 344 of the chip carrier socket 302. The positioning of the chip carrier 308 in the recess 344 places leads 306 of the chip carrier in proximity to the terminals 304. Also, the ends of the leads 306 are provided in the recesses 352.

With the chip carrier properly positioned in the recess of the chip carrier socket, the spacer 378 is inserted over the leads 306. The insertion of the spacer continues until the contact surfaces 380 engage the top edges of the base portions 316. With the spacer 378 fully inserted, the spacer cooperates with the retention portions 314 and the contact portions 318 to insure that the leads 306 are positioned in electrical engagement with the terminals 304.

During the insertion, the leads 306 and spacer 378 are inserted between the retention portions 314 and the contact portions 318. The space provided between the portions 314, 318 is less than the width of the spacer and the leads. Consequently, as the spacer is inserted between the portions, the spacer must be moved to a stressed position, causing the leads to be forced against the contact portions 318. This force insures that the leads 306 will frictionally engage the contact portions 318 as insertion occurs. In other words, a contact wipe action will occur as the insertion takes place. It is important to note that the spacer is deformed at all times when it is inserted into the chip carrier socket. The amount of force applied is directly related to the configuration of wall 390. Consequently, a force exists at all times between the leads 306 and the contact portions 318 of the terminals, thereby insuring that a positive electrical connection is maintained therebetween.

Changes in construction will occur to those skilled in the art and various apparently different modifications and embodiments may be made without departing from the scope of the invention. The matter set forth in the foregoing description and accompanying drawings is offered by way of illustration only.

We claim:

1. A chip carrier socket for use with a chip carrier, the chip carrier having leads which extend therefrom, the chip carrier socket comprising:
   terminals provided in a lead receiving recess of the chip carrier socket, each terminal has a mounting portion and a chip carrier receiving portion;
   resilient spacer means, the resilient spacer means being movable between a first position, in which the spacer means is not provided in the lead receiving recess, and a second position, in which the spacer means is provided in the lead receiving recess, adjacent to the chip carrier receiving portions of the terminals;
   whereby after the leads of the chip carrier have been inserted into the lead receiving recess, in cooperation with the terminals, the resilient spacer means is moved to the second position, such that the resilient spacer means engages the leads of the chip carrier, forcing the leads of the chip carrier into electrical connection with the terminals of the chip carrier socket.

2. A chip carrier socket as recited in claim 1 wherein the chip carrier receiving portions of the terminals have retention legs and contact legs.

3. A chip carrier socket as recited in claim 2 wherein the resilient spacer means has a generally U-shaped configuration, the spacing between ends of the resilient spacer means is greater than the spacing between the contact legs and the retention legs, so that the resilient spacer means is moved from the first position to the second position, the resilient spacer means is resiliently deformed, causing a force to be applied to the leads of the chip carrier, thereby insuring that the leads will be provided in electrical engagement with the contact legs of the terminals.

4. A chip carrier socket as recited in claim 3 wherein as the resilient spacer means is inserted into the lead receiving recess, the resilient spacer means will engage the leads of the chip carrier, causing the leads of the chip carrier to wipingly engage the contact legs of the terminals.

5. A chip carrier socket as recited in claim 3 wherein the ends of the resilient spacer means have arcuate surfaces to allow the resilient spacer means to adequately cooperate with the terminals of the chip carrier socket and the leads of the chip carrier.

* * * * *